United States Patent
Im et al.

(10) Patent No.: US 10,090,279 B2
(45) Date of Patent: Oct. 2, 2018

(54) STRAY INDUCTANCE REDUCTION IN PACKAGED SEMICONDUCTOR DEVICES AND MODULES

(71) Applicant: SEMICONDUCTOR COMPONENTS INDUSTRIES, LLC, Phoenix, AZ (US)

(72) Inventors: Seungwon Im, Bucheon (KR); Mankyo Jong, Bucheon (KR); ByoungOk Lee, Bucheon-si (KR); Joonseo Son, Seoul (KR); Oseob Jeon, Seoul (KR)

(73) Assignee: Semiconductor Components Industries, LLC, Phoenix, AZ (US)

( * ) Notice: Subject to any disclaimer, the term of this patent is extended or adjusted under 35 U.S.C. 154(b) by 0 days.

(21) Appl. No.: 15/449,473

(22) Filed: Mar. 3, 2017

(65) Prior Publication Data

US 2018/0254262 A1    Sep. 6, 2018

(51) Int. Cl.
*H01L 25/065* (2006.01)
*H01L 23/31* (2006.01)
*H01L 29/739* (2006.01)

(52) U.S. Cl.
CPC ...... *H01L 25/0657* (2013.01); *H01L 23/3114* (2013.01); *H01L 29/7393* (2013.01)

(58) Field of Classification Search
CPC ............... H01L 23/34; H01L 23/4334; H01L 23/49513; H01L 23/49568; H01L 23/3735;
(Continued)

(56) References Cited

U.S. PATENT DOCUMENTS

2009/0116197 A1* 5/2009 Funakoshi ......... H01L 21/4882
                                                         361/719
2010/0237507 A1* 9/2010 Yamada ................. H01L 23/38
                                                         257/773
(Continued)

FOREIGN PATENT DOCUMENTS

EP    2015626 A2    1/2009
EP    2725699 A1    4/2014
(Continued)

OTHER PUBLICATIONS

Power Electronic Systems Laboratory, "Ultra-Low-Inductance Power Module for Fast Switching Semiconductors," Proceedings of the PCIM Europe Conference for Power Electronics, Intelligent Motion, Renewable Energy and Energy Management, Nuremberg, Germany, May 14-16, 2013.
(Continued)

*Primary Examiner* — Michael Carter
*Assistant Examiner* — Mohammed R Alam
(74) *Attorney, Agent, or Firm* — Brake Hughes Bellermann LLP

(57) ABSTRACT

In a general aspect, an apparatus can include a first substrate operatively coupled with a second substrate. The apparatus can also include a power supply terminal assembly including a first power supply terminal aligned along a first plane, the first power supply terminal being electrically coupled with the first substrate. The power supply terminal assembly can also include a second power supply terminal aligned along a second plane, the second power supply terminal being electrically coupled with the second substrate. The power supply terminal assembly can further include a power supply terminal frame having an isolation portion disposed between the first power supply terminal and the second power supply terminal and a retention portion disposed around a portion of the first power supply terminal and disposed around a portion of the second power supply terminal.

20 Claims, 8 Drawing Sheets

(58) Field of Classification Search
CPC ... H01L 24/33; H01L 24/32; H01L 23/49562; H01L 2924/00014; H01L 2924/181; H01L 2924/351; H01L 2924/1305; H01L 2224/33181; H01L 2924/13; H01L 2224/3318

See application file for complete search history.

(56) References Cited

U.S. PATENT DOCUMENTS

| | | |
|---|---|---|
| 2013/0001759 A1 | 1/2013 | Kim et al. |
| 2013/0062751 A1 | 3/2013 | Takagi et al. |
| 2014/0291696 A1* | 10/2014 | Horimoto ........... H01L 23/4334 257/77 |
| 2016/0308456 A1 | 10/2016 | Nakatsu et al. |
| 2017/0237311 A1* | 8/2017 | Sakai ................... H02K 5/225 310/71 |

FOREIGN PATENT DOCUMENTS

| | | |
|---|---|---|
| JP | 2001326325 A | 11/2001 |
| JP | 2010016947 A | 1/2010 |
| WO | 2016017267 A1 | 2/2016 |

OTHER PUBLICATIONS

Extended European Search Report for European Application No. 18157477.3, dated Jul. 19, 2018, 10 pages.

* cited by examiner

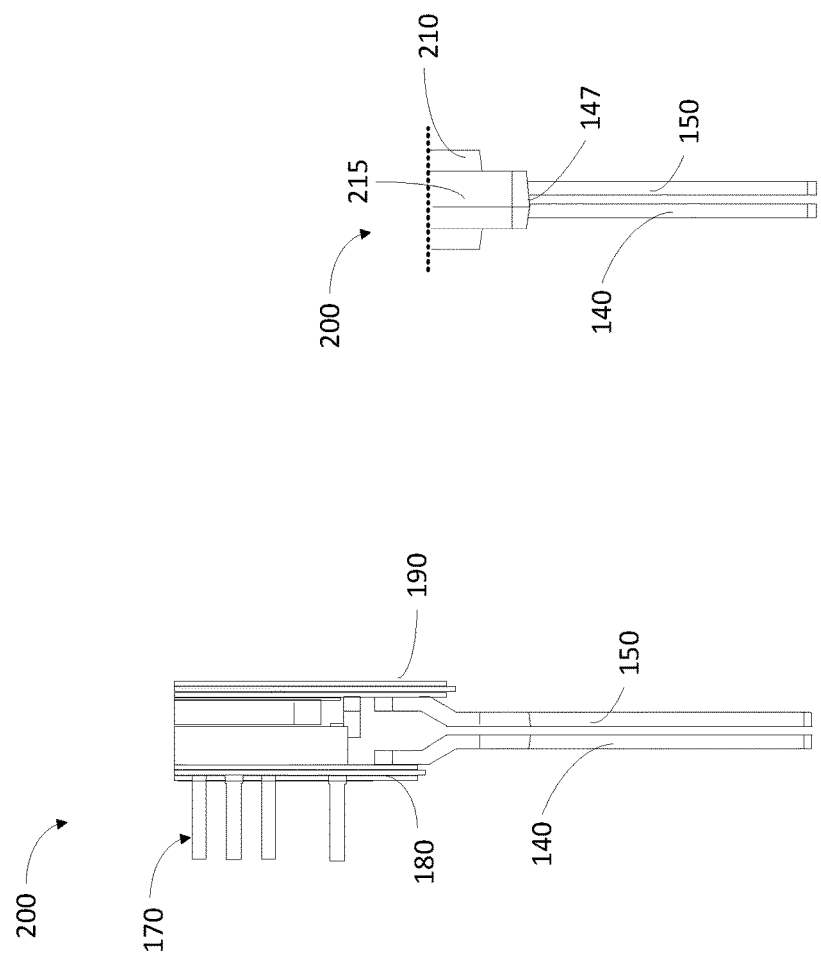

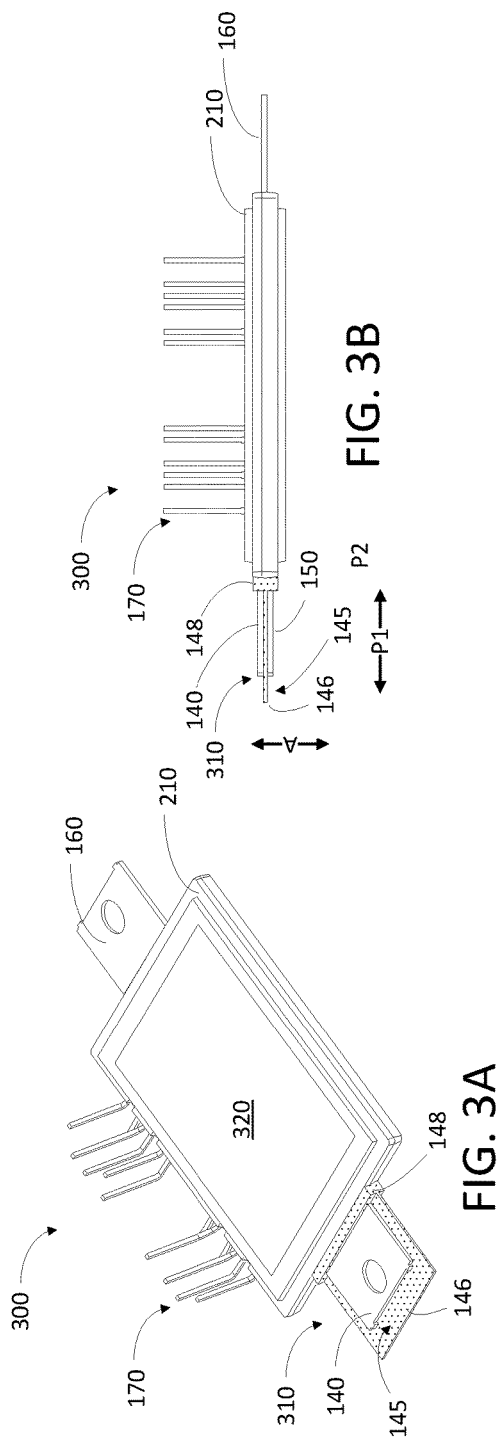
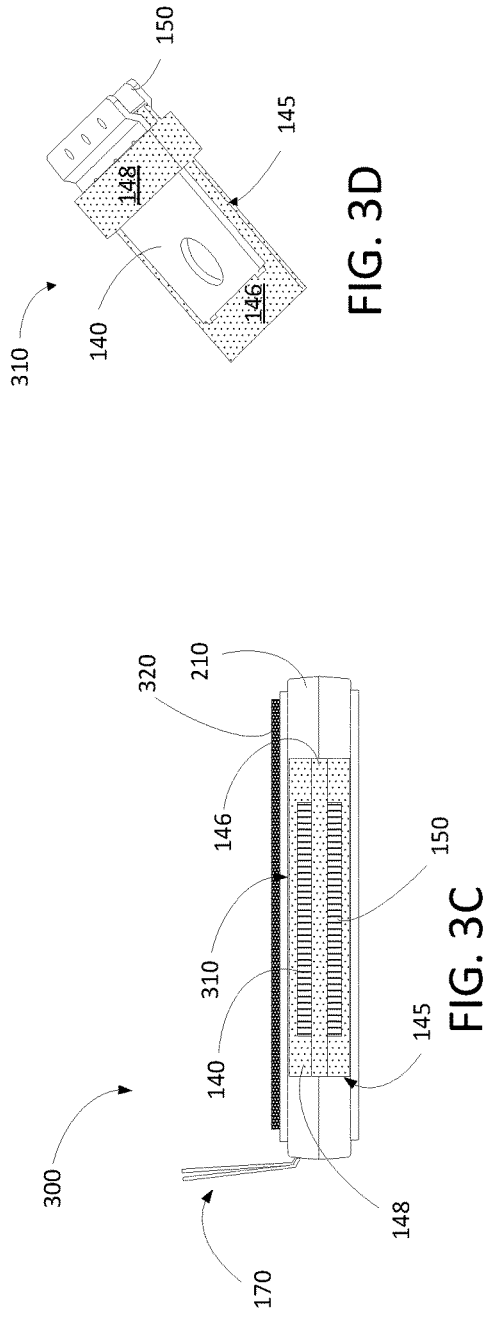
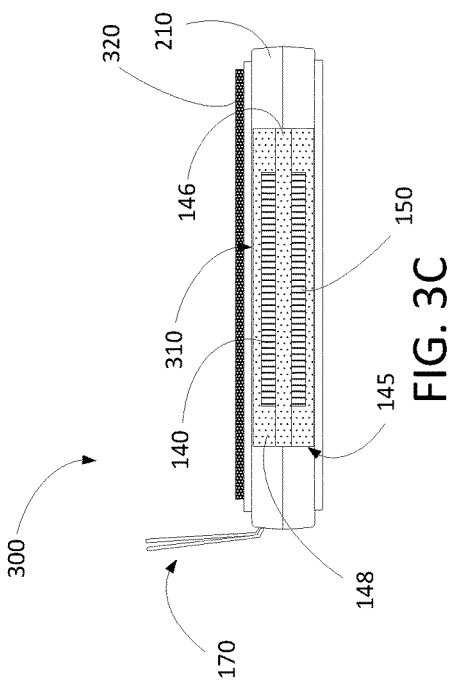

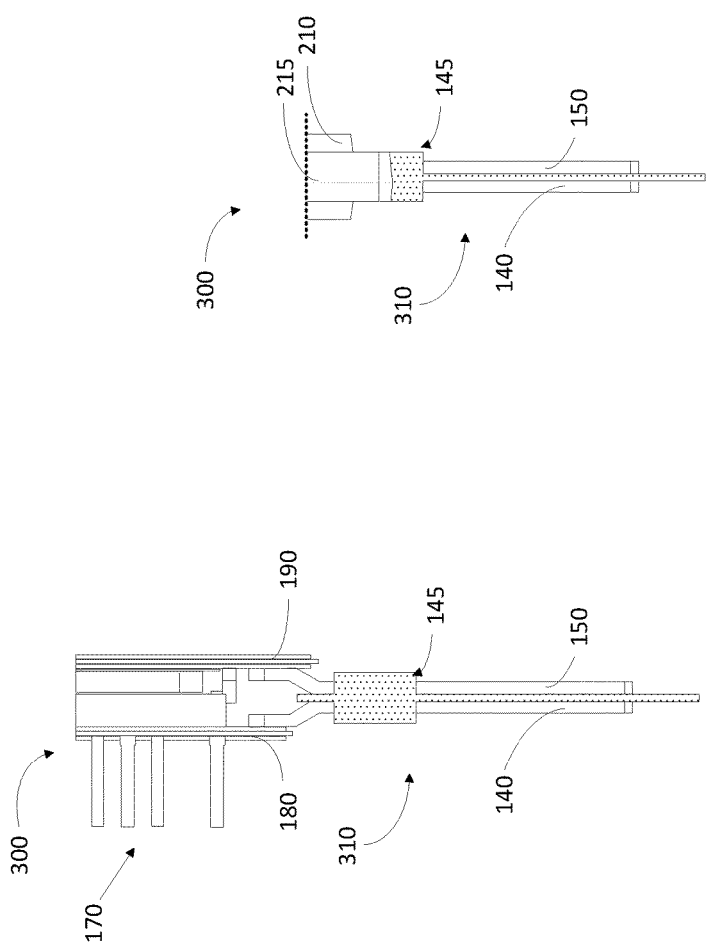
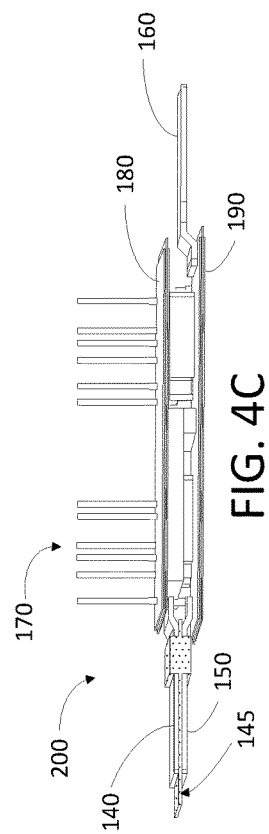

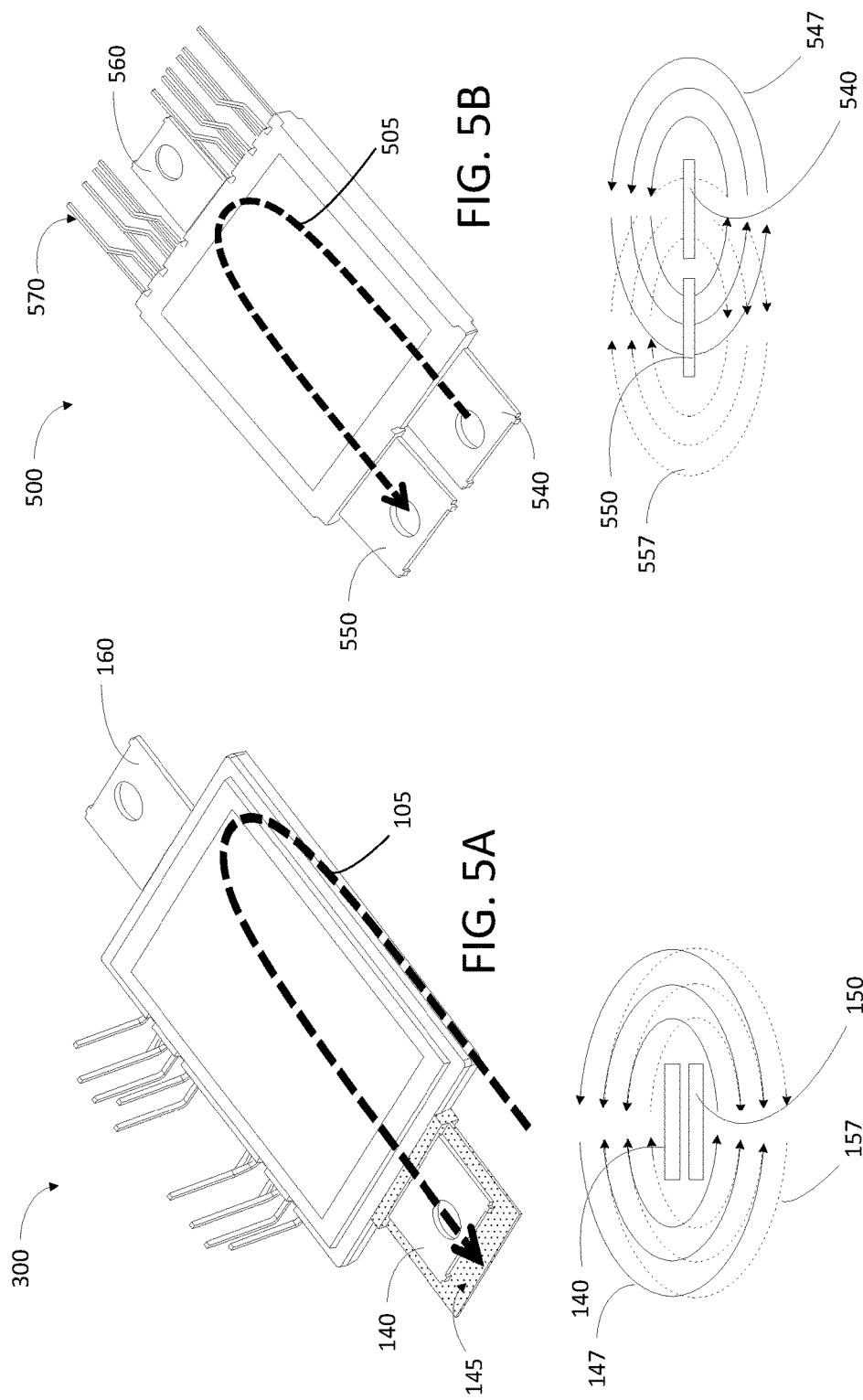

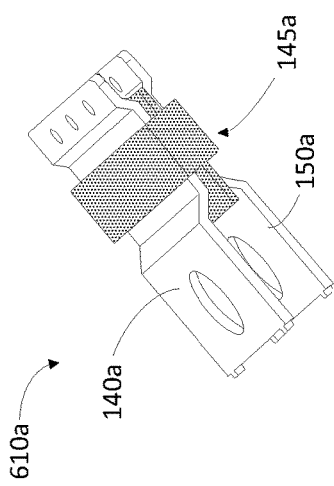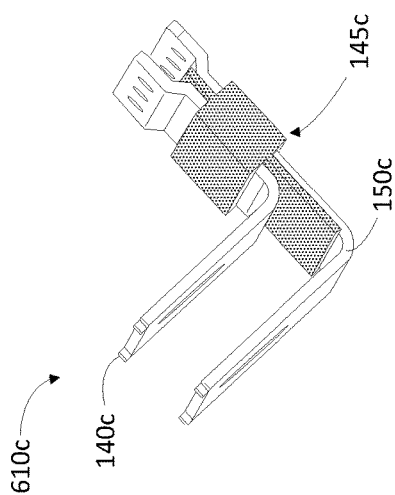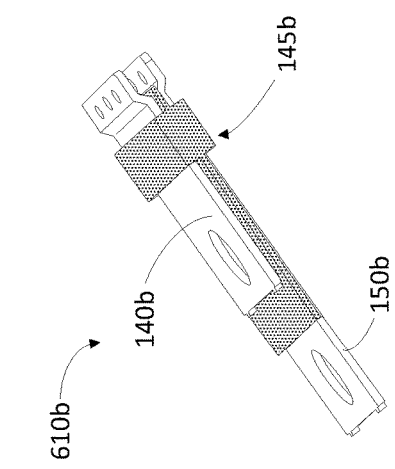

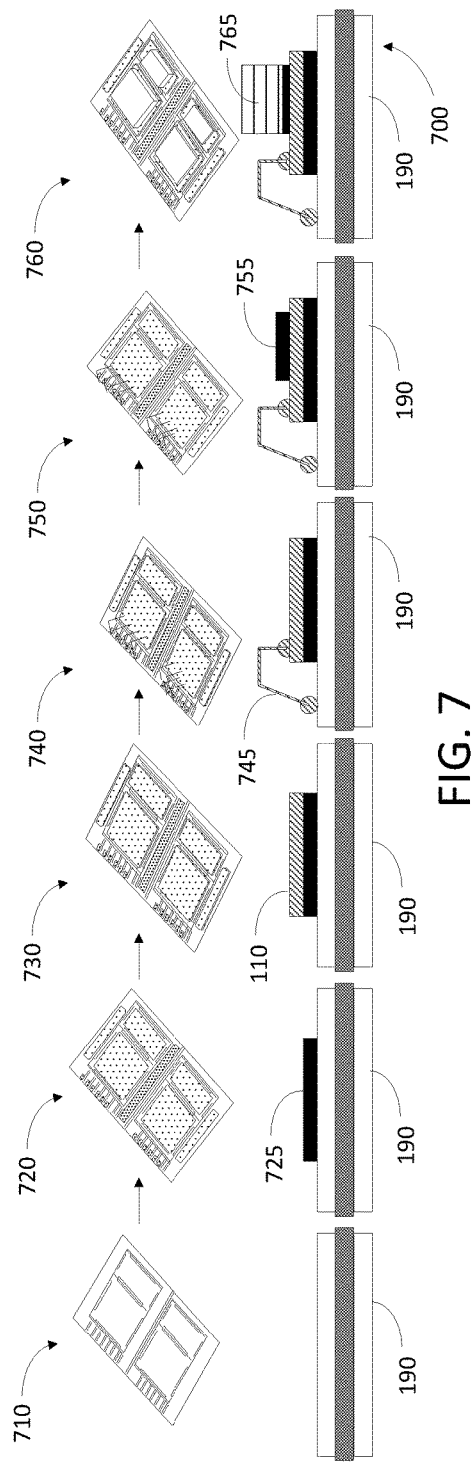
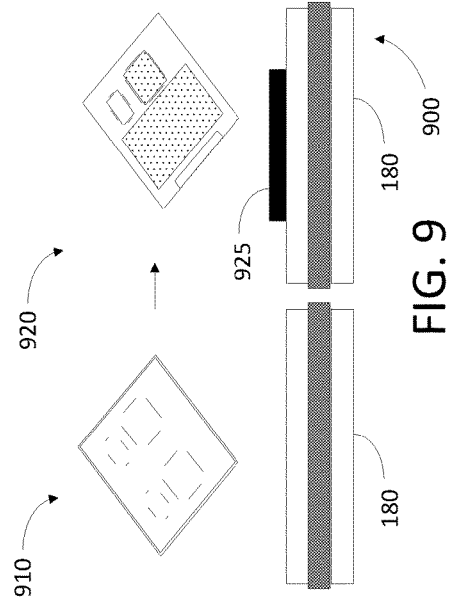
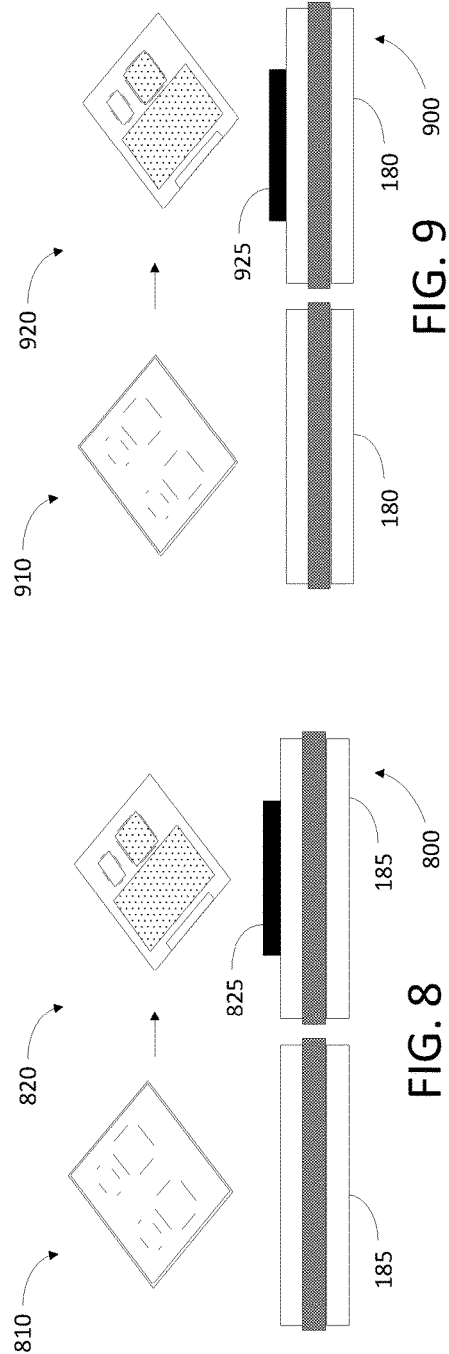
FIG. 7
FIG. 8
FIG. 9

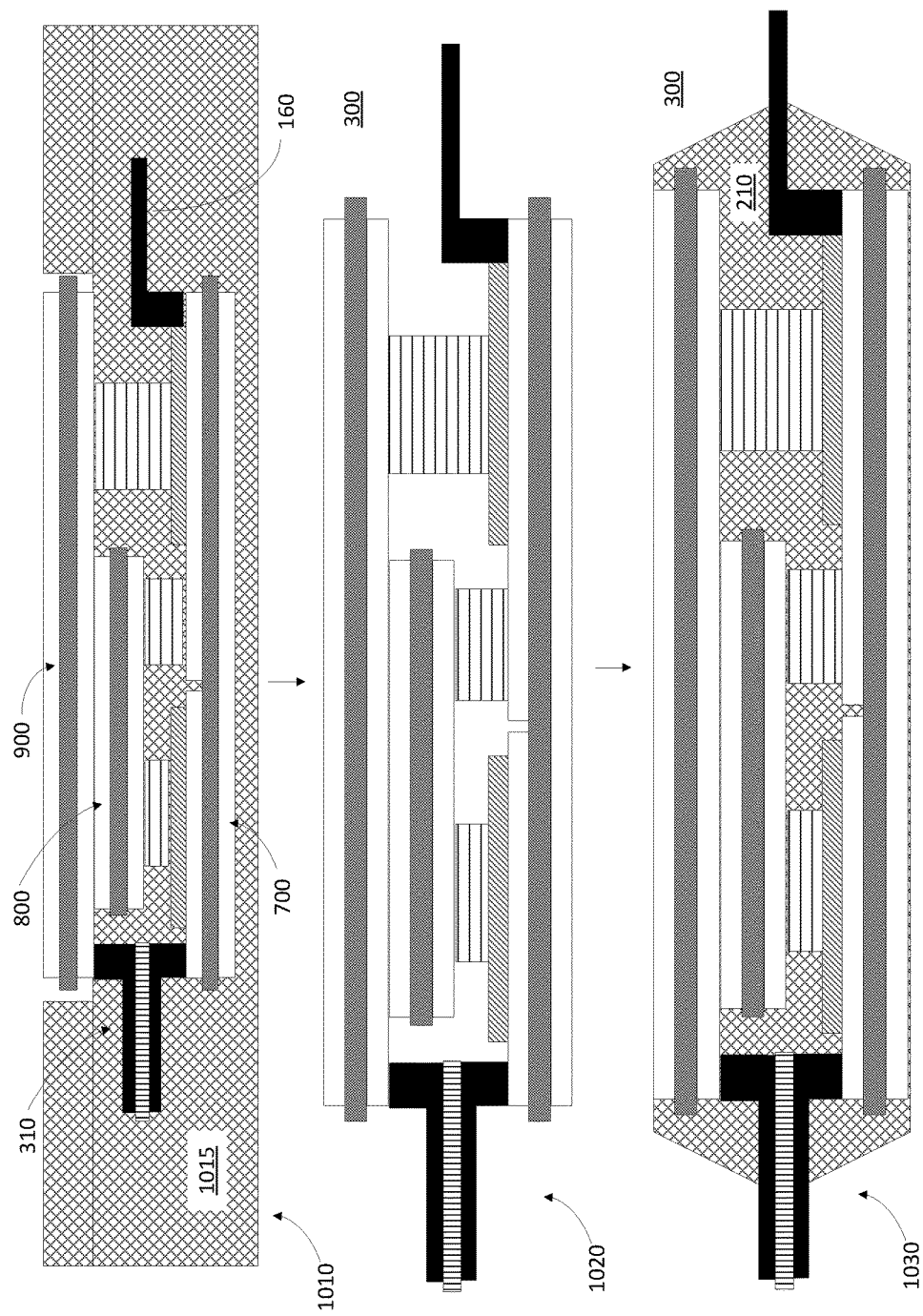

STRAY INDUCTANCE REDUCTION IN PACKAGED SEMICONDUCTOR DEVICES AND MODULES

TECHNICAL FIELD

This description relates to packaged semiconductor devices and/or semiconductor device modules (packaged devices). More specifically, this description relates to packaged devices with including power terminal assemblies with power terminals that are arranged in parallel to reduce stray inductance.

SUMMARY

In a general aspect, an apparatus can include a first substrate, a second substrate operatively coupled with the first substrate and a power supply terminal assembly. The power supply terminal assembly can include a first power supply terminal aligned along a first plane. The first power supply terminal can be electrically coupled with the first substrate. The power supply terminal assembly can also include a second power supply terminal aligned along a second plane. The second power supply terminal can be electrically coupled with the second substrate. The power supply terminal assembly can further include a power supply terminal frame. The power supply terminal frame can include an isolation portion and a retention portion. The isolation portion can be disposed between the first power supply terminal and the second power supply terminal. The retention portion can be disposed around a portion of the first power supply terminal and disposed around a portion of the second power supply terminal. The retention portion can affix the first power supply terminal to a first side of the isolation portion, and affix the second power supply terminal to a second side of the isolation portion such that the first plane is parallel to the second plane.

Implementations can include one or more of the following features. For example, the portion of the first power supply terminal can be vertically aligned with the portion of the second power supply terminal along an axis that is orthogonal to the first plane and the second plane. The first power supply terminal can be substantially entirely vertically aligned with the second power supply terminal along an axis that is orthogonal to the first plane and the second plane. The first power supply terminal can be direct lead attached to the first substrate and the second power supply terminal is direct lead attached to the second substrate. The power supply terminal frame can be formed from one of plastic, epoxy and ceramic.

The first power supply terminal can have a first length and the second power supply terminal can have a second length, and the second length can be different than the first length. Each of the first power supply terminal and the second power supply terminal can be L-shaped. A portion of the first power supply terminal and a portion of the second power supply terminal disposed outside a molding compound of the apparatus can collectively define a Y-shape.

In another general aspect, an apparatus can include a power semiconductor circuit, a molding compound that at least partially encapsulates the power semiconductor circuit and a power terminal assembly. The power terminal assembly can include a power supply terminal frame, a first power supply terminal aligned along a first plane and a second power supply terminal aligned along a second plane. The first power supply terminal can be operatively coupled with the power semiconductor circuit and affixed in the power supply terminal frame. The second power supply terminal can be operatively coupled with the power semiconductor circuit and affixed in the power supply terminal frame such that the second plane is parallel to the first plane and at least a portion of the first power supply terminal is vertically aligned with the second power supply terminal along an axis that is orthogonal to the first plane and the second plane. A first portion of the power terminal assembly can be encapsulated in the molding compound and a second portion of the power terminal assembly can be disposed outside the molding compound.

Implementations can include one or more of the following features. For example, the apparatus can include an output signal terminal operatively coupled with the power semiconductor circuit. A first portion of the output signal terminal can be encapsulated in the molding compound and a second portion of the output signal terminal can be disposed outside the molding compound at a first end of the apparatus. The power terminal assembly can have a portion disposed outside the molding compound at a second end of the apparatus that is opposite the first end.

The first power supply terminal can have a first length and the second power supply terminal can have a second length. The second length can be different than the first length.

The first power supply terminal can be substantially entirely vertically aligned with the second power supply terminal along the axis that is orthogonal to the first plane and the second plane.

Each of the first power supply terminal and the second power supply terminal can be L-shaped.

A portion of the first power supply terminal and a portion of the second power supply terminal being disposed outside the molding compound can collectively define a Y-shape.

The power supply terminal frame can include a first portion that electrically isolates the first power supply terminal with the first power supply terminal from the second power supply terminal and a second portion that that affixes the first power supply terminal to a first side of the first portion of the power supply terminal frame and affixes the second power supply terminal to a second side of the first portion of the power supply terminal frame. The second side of the first portion of the power supply terminal frame can be opposite the first side of the first portion of the power supply terminal frame. The power supply terminal frame is formed from one of plastic, epoxy and ceramic.

In another general aspect, an apparatus can include a first substrate having a plurality of semiconductor devices disposed thereon, a second substrate operatively coupled with the first substrate and a third substrate operatively coupled with the first substrate and the second substrate. The third substrate can be disposed between the first substrate and the second substrate. The apparatus can also include a power supply terminal assembly having a first power supply terminal, a second power terminal and a power supply terminal frame. The first power supply terminal can be aligned along a first plane. The first power supply terminal can be electrically coupled with the first substrate. The second power supply terminal can be aligned along a second plane. The second power supply terminal can be electrically coupled with the second substrate. The power supply terminal frame can include an isolation portion and a retention portion. The isolation portion can be disposed between the first power supply terminal and the second power supply terminal. The retention portion can be disposed around a portion of the first power supply terminal and disposed around a portion of the second power supply terminal. The retention portion can affix the first power supply terminal to a first side of the isolation portion and affix the second power supply terminal to a second side of the isolation portion, such that the first plane is parallel to the second plane.

Implementations can include one or more of the following features. For example, the first power supply terminal can be substantially entirely vertically aligned with the second power supply terminal along an axis that is orthogonal to the first plane and the second plane. The first power supply terminal can include a flared portion that is direct lead attached to the first substrate. The second power supply terminal can include a flared portion that is direct lead attached to the second substrate The apparatus can include an output signal terminal that is direct lead attached to the first substrate. The first power supply terminal can be disposed at a first end of the first substrate and the output signal terminal can be disposed at a second end of the first substrate, where the second end is opposite the first end.

BRIEF DESCRIPTION OF THE DRAWINGS

FIG. 2A is a diagram illustrating a sectional view of a power semiconductor module with parallel power supply terminals, prior to transfer molding with an epoxy molding compound, according to an implementation.

FIG. 2B is a diagram illustrating a sectional view of the power semiconductor module of FIG. 2A after transfer molding, according to an implementation.

FIG. 3A is a diagram illustrating an isometric view of a power semiconductor module (e.g., packaged assembly) with parallel power supply terminals included in a power terminal assembly, according to an implementation.

FIG. 3B is a diagram illustrating a side view of the power semiconductor module of FIG. 3A.

FIG. 3C is a diagram illustrating an end view of the power semiconductor module of FIG. 3A.

FIG. 3D is a diagram illustrating an isometric view of the power terminal assembly of the power semiconductor module of FIG. 3A, according to an implementation.

FIG. 4A is a diagram illustrating a sectional view of the power semiconductor module of FIGS. 3A-3C prior to transfer molding with an epoxy molding compound, according to an implementation.

FIG. 4B is a diagram illustrating a sectional view of the power semiconductor module of 4A (and FIGS. 3A-3C) after transfer molding, according to an implementation.

FIG. 4C is a diagram illustrating a side view of the power semiconductor module of FIGS. 3A-3C prior to transfer molding with an epoxy molding compound.

FIGS. 5A and 5B are diagrams illustrating a comparison of a main current path and associated magnetic fields of the power semiconductor module of FIG. 3A (shown in FIG. 5A) and a main current path and associated magnetic fields of a power semiconductor module with coplanar power terminals (shown in FIG. 5B), according to an implementation.

FIGS. 6A-6C are diagrams illustrating various configurations of power terminal assemblies, according to respective implementations.

FIG. 7 is a diagram illustrating a process flow method for producing a first substrate assembly that can be included in a packaged semiconductor device and/or module, according to an embodiment.

FIG. 8 is a diagram illustrating a process flow method for producing a second substrate assembly that can be included in a packaged semiconductor device and/or module, according to an embodiment.

FIG. 9 is a diagram illustrating a process flow method for producing a third substrate assembly that can be included in a packaged semiconductor device and/or module, according to an embodiment.

FIG. 10 is a diagram illustrating a process flow method for producing a semiconductor device and/or module including the substrate assemblies of FIGS. 7-9, according to an embodiment.

Figure 1:
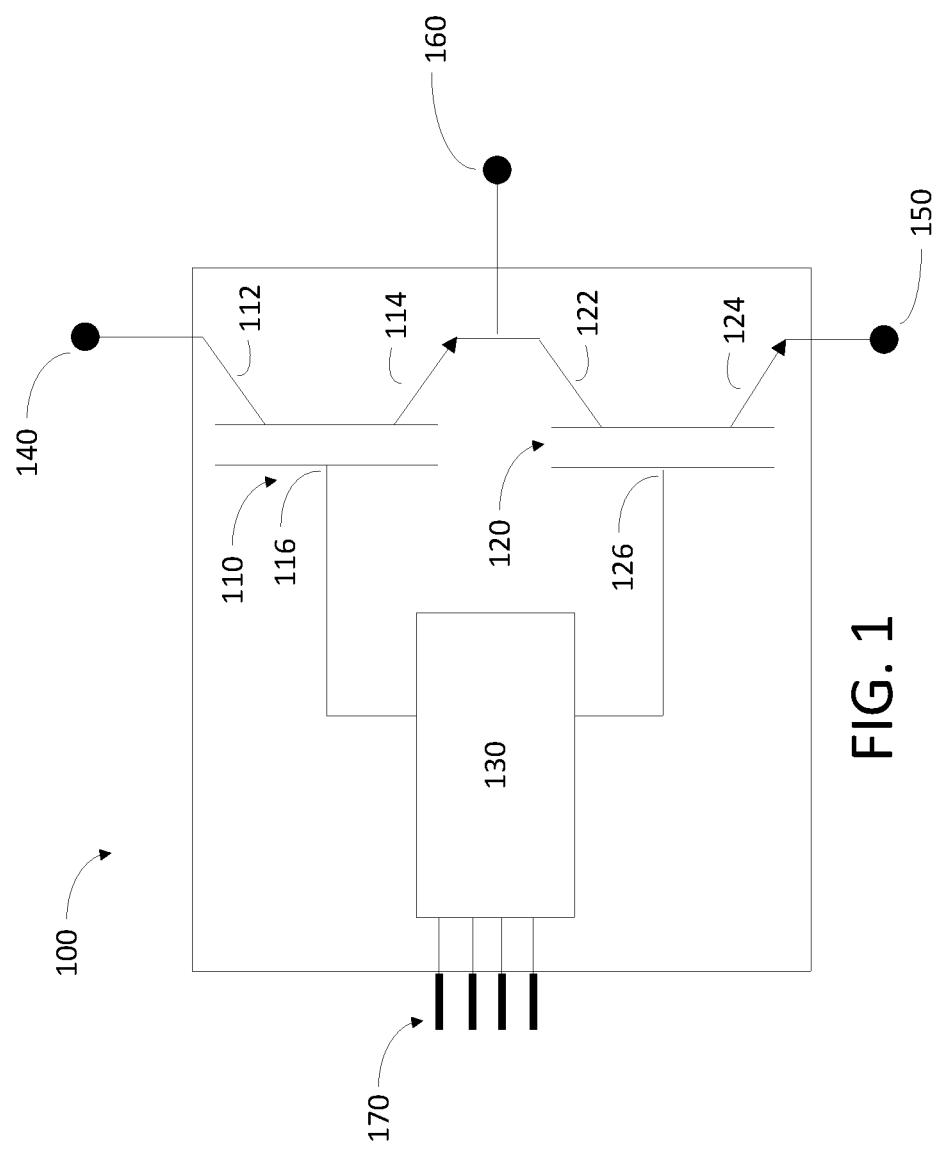
FIG. 1 is a schematic block diagram of a power semiconductor device module, according to an implementation.

In the drawings, like reference symbols in the various drawings indicate like elements. Reference numbers for some like elements may not be repeated for all such elements. In certain instances, different reference numbers may be used for like elements, or similar elements. Some reference numbers for certain elements of a given implementation may not be repeated in each drawing corresponding with that implementation. Some reference numbers for certain elements of a given implementation may be repeated in other drawings corresponding with that implementation, but may not be specially discussed with reference to each corresponding drawing.

DETAILED DESCRIPTION

This disclosure relates to various packaged semiconductor device apparatus and associated methods of manufacturing packaged semiconductor devices, such as packaged power semiconductor modules. The approaches illustrated and described herein can be used to produce a number of different packaged semiconductor devices that operate with reduced stray inductance as compared to current implementations, where stray inductance can be measured as a series inductance between power supply terminals. Such stray inductance is caused (e.g., during operation of a given device or module) by magnetic fields that are generated by currents flowing into and out of the power supply terminals and magnetic field lines associated with one power supply terminal being incident on the other power supply terminal, and vice versa.

In the approaches discussed herein, stray inductance can be reduced as a result of implementing power supply terminals (e.g., DC+ and DC− terminals) in a power terminal assembly, where the power supply terminals (metal leads in a semiconductor package assembly) are arranged (physically arranged) in parallel with one another (rather than being arranged to be coplanar and laterally spaced from one another, as in current implementations). Such arrangements can reduce stray inductance of a power semiconductor device or module. Such reductions in stray inductance are realized as a result of overlap (e.g., increased overlap as compared to coplanar arrangements) between respective magnetic fields for each power supply terminal causing those magnetic fields to cancel each other rather than being incident on the opposing power supply terminal, thus reducing stray inductance FIG. 1 is a schematic block diagram of a power semiconductor device module circuit 100, according to an implementation. The circuit 100 is given by way of example and for purposes of illustration. In other implementations, the approaches described herein can be used in conjunction with other semiconductor devices, other power semiconductor circuits, other semiconductor device modules, etc. While certain elements of the circuit 100 are referenced with respect to other drawings, in other implementations, other arrangements and/or approaches are possible.

As shown in FIG. 1, the circuit 100 can include a first power semiconductor device, an insulated-gate bipolar transistor (IGBT) 110, and a second power semiconductor device, an IGBT 120. The IGBTs 110 and 120 can be implemented in one or more semiconductor die. In other implementations, other power semiconductor devices could be used such as power metal-oxide semiconductor field effect transistors (power FETs), or circuits having other arrangements could be implemented. In the circuit 100, the IGBT 110 includes a collector 112, an emitter 114 and a gate 116. Likewise, the IGBT 120 includes a collector 122, an emitter 124 and a gate 126. The emitter 114 of the IGBT 110 and the collector 122 of the IGBT 120 are electrically coupled to a common node of the circuit 100, on which an output signal (e.g., a regulated voltage) can be produced by the circuit 100. The circuit 100 also includes a control circuit 130, which can be an integrated circuit that is configured to control operation of the IGBTs 110 and 120 (e.g., to drive the gates 116 and 126) to produce the output signal.

In the circuit 100, a first power supply terminal 140 (e.g., a DC+ terminal, a Vdd terminal, etc.) can be coupled with the collector 112 of the IGBT 110. A second power supply terminal 150 (e.g., a DC− terminal, an electrical ground terminal, etc.) can be coupled with the emitter 124 of the IGBT 120. Further, an output terminal 160 can be coupled with the common node of the emitter 114 of the IGBT 110 and the collector 122 of the IGBT 120. As described further below, the first power supply terminal 140, the second power supply terminal 150 and the output terminal 160 can be implemented using metal terminals (metal leads) that are included in a packaged semiconductor assembly or module. For instance, the terminals 140, 150 and 160 can, in some implementations, be electrically and physically coupled with a respective substrate (e.g., of one or more substrates on which the IGBTs 110 and 120, and the control circuit 130 are implemented) included in a packaged semiconductor assembly. For instance, the terminals 140, 150 and 160 can be directly bonded to substrates that are used to implement the circuit 100, such as in the example implementations described below.

As further illustrated in FIG. 1, the circuit 100 can also include a plurality of signal pins that are operatively coupled with the control circuit 130. In other implementations, signal pins 170 could be operatively coupled with other elements of the circuit 100, such as the IGBTs 110 and 120. In FIG. 1, specific connections for the signal pins 170 (e.g., between the IGBTs 110 and 120 and the signal pins 170 and/or between the IGBTs 110 and 120 and the control circuit 130) are not shown. The particular signal pins 170 (and connections to/from the signal pins 170) that are implemented in the circuit 100 will depend on the particular implementation. As some examples, the signal pins 170 could include gate control signal pins, temperature sense signal pins, voltage sense signal pins, etc.

FIG. 2A is a diagram illustrating a sectional view of a power semiconductor module 200 with parallel power supply terminals, prior to transfer molding of the module 200 with an epoxy molding compound, according to an implementation. In this example, the module 200, as with the other power semiconductor modules described below, can be used to implement the circuit 100 shown in FIG. 1. Accordingly, elements of the module 200 that correspond with elements of the circuit 100 shown in FIG. 1 are referenced with like reference numbers. As shown in FIG. 2A, the module 200 can include a first substrate 180 and a second substrate 190. Depending on the particular implementation, the substrates 180 and 190 can be ceramic substrates with printed circuit (copper) traces that are used to interconnect the elements of the circuit 100 to each other. Such substrates can be referred to as direct-bonded copper (DBC) substrates, which can include printed copper patterns on surfaces of a dielectric (e.g., in a stack). In other implementations, the substrates 180 and 190 can include (e.g., be formed from) different materials. The specific arrangement of the elements of the circuit 100 on the substrates 180 and 190, as well as operative (electrical) connections between the substrates 180 and 190 will depend on the particular implementation. In some implementations, the module 200 (or other modules) can include a third (e.g., middle) substrate, such as described herein with respect to the process flow illustrated in FIGS. 7-10. In other implementations, other numbers of substrates can be used.

As shown in FIG. 2A, the power supply terminal 140 (which can be a copper metal lead having a configuration such as shown in, e.g., FIG. 3D) can be electrically and physically coupled with the substrate 180 using, e.g., direct lead attachment (DLA). Likewise, the power supply terminal 150 (which can be a copper metal lead having a configuration such as shown in, e.g., FIG. 3D) can be electrically and physically coupled with the substrate 190 using, e.g., DLA. In other implementations, techniques other than DLA can be used to attach the terminals 140 and 150, respectively, to the substrates 180 and 190. As shown in FIG. 2A (and FIG. 2B) the terminal 140 is arranged in parallel with the terminal 150, which, as is discussed in further detail with respect to FIGS. 5A and 5B, can reduce stray inductance, as compared to packaged semiconductors having power supply terminals that are coplanar and laterally spaced from each other.

FIG. 2B is a diagram illustrating a sectional view of the power semiconductor module 200 of FIG. 2A after transfer molding, according to an implementation. As shown in FIG. 2B, the module 200 (e.g., the substrates 180 and 190 and other components of the circuit 100) can be encapsulated in an epoxy molding compound (EMC) 210 using, e.g., a transfer molding process. In a transfer molding process a two-part molding cavity can be used, where the module 200 shown in FIG. 2A, is placed within the two part cavity and EMC 210 (in liquid form) is flowed (transferred) into the two-part molding cavity to encapsulate portions of the module 200 (such as shown FIG. 2B) in the EMC 210. The EMC 210 is cooled, which causes it to set. The two-part molding cavity is then be opened and the encapsulated module 200 of FIG. 2B removed. As shown by FIGS. 2A and 2B the terminals 140 and 150 can each have a first portion that is encapsulated in the EMC 210 and a second portion that is disposed outside the EMC 210 (e.g., for connection to other devices, such as positive and negative terminals of a power supply, power supply busses on a printed circuit board, etc.)

In such transfer molding processes, a potting line (e.g., seam, etc.) 215 is formed along the mating surfaces of the two parts of the molding cavity, where the two parts can be referred to as an upper cavity and a lower cavity. In the module 200, the potting line 215, which is disposed between the terminal 140 and the terminal 150, can cause a leakage current (e.g., EMC leakage) to be conducted between the terminals 140 and 150 during operation of the module 200. Such leakage current between the power supply terminals 140 and 150 can occur as a result of solder plating residue (e.g., from a solder plating operation that is used to plate the terminals 140, 150, 160 and signal leads 170) being formed on a surface 147 of the EMC 210, where the solder plating residue can be disposed/retained on the potting line 215 and, during operation of the module 200, can conduct a leakage current between the power supply terminals 140 and 150, which is undesirable.

FIG. 3A is a diagram illustrating an isometric view of a power semiconductor module (e.g., packaged assembly) 300 with parallel-arranged power supply terminals 140 and 150 that are included in a power terminal assembly 310, according to an implementation. As with the module 200 of FIGS. 2A and 2B, the module 300 can be used to implement the circuit 100 shown in FIG. 1. Accordingly, elements of the module 300 that correspond with elements of the circuit 100 shown in FIG. 1 are referenced with like reference numbers.

As shown in FIG. 3A, the module 300 can include the signal pins 170, with portions of the module 300 being encapsulated in EMC 210. The module 300 can also include a heat slug 320 that is exposed through the EMC 210 and can be coplanar (substantially coplanar) with a surface of the EMC 210, as is shown in FIG. 3A. The heat slug 320 can be configured to dissipate heat from the components of the circuit 100 implemented in the module 300. For instance, the heat slug 320 can be disposed on a substrate of the module 300, such as the substrate 180 and/or the substrate 190. In other words, though not specifically shown in FIG. 3A, the module 300 could include two or more heat slugs, such as one for each substrate included in the module 300 (such as the substrates 180 and 190 shown in FIGS. 4A and 4C). In certain implementations, the heat slug 320 (such as shown in FIG. 3D) can be disposed (e.g., at least partially disposed) above the surface of the EMC 210, rather than being coplanar (substantially coplanar) with the EMC 210 (e.g., a surface of the EMC).

FIG. 3B is a diagram illustrating a side view of the power semiconductor module 300 of FIG. 3A. Referencing both FIGS. 3A and 3B, the module 300 can include a power supply terminal assembly 310, which, as discussed below, can prevent EMC leakage that can occur in the module 200, as discussed above with respect to FIG. 2B. The power supply terminal assembly 310 can include a power supply terminal frame 145 that includes an isolation portion 146 and a retention portion 148. Depending on the particular implementation, the power supply terminal frame 145 can be monolithic, while in other implementations, the isolation portion 146 and the retention portion 148 can be separate components that are assembled, e.g., using an adhesive, to form the frame 145.

As shown in FIGS. 3A, 3B and 3C, the power terminal assembly 310 can also include the terminal 140 and the terminal 150, where the terminal 140 is aligned along a first plane, and the terminal 150 is aligned along a second plane that is parallel to the first plane, where the first plane and the second plane are aligned along the axes P1 and P2 as shown in FIG. 3B (e.g., where axis P2 goes in and out of the page in FIG. 3B). The isolation portion 146 of the frame 145 can be disposed between the terminals 140 and 150 and electrically isolate the terminal 140 from the terminal 150 and prevent EMC leakage. In this example implementation, the isolation portion 146 can be aligned along a third plane that is parallel to and disposed between the first plane and the second plane. In other implementations, other arrangements are possible. The isolation portion 146 can also define (establish, etc.) a spacing (distance) between the terminals 140 and 150, or at least a portion of the terminals, such as in the implementations, shown in FIGS. 6A-6C, for example (e.g., to align their corresponding magnetic fields to reduce stray inductance during operation of the module 300). In power supply terminal assembly 310, the isolation portion 146 can have a surface area that is greater than a surface area of a portion of the terminal 140 exposed outside the EMC 210 and/or greater than a surface area of a portion of the terminal 150 exposed outside of the EMC 210. In other implementations (such as those shown in FIGS. 6A-6C), an isolation portion of a power terminal assembly frame can have a surface area that is less than respective surface areas or one, or both corresponding power supply terminals in a power terminal assembly (e.g., power terminal assemblies 610a, 610b and 610c).

The retention portion 148 of the frame 145, as shown in FIGS. 3A and 3B (as well as FIG. 3D) can be disposed around at least a portion of the terminal 140 and at least a portion of the terminal 150 (e.g., as a collar around the terminals 140 and 150. Accordingly, the retention portion 148 can affix the terminals 140 and 150 to respective first and second sides of the isolation portion 146 and align the terminals 140 and 150 so the first plane (along which the terminal 140 is aligned) is parallel with the second plane (along which the terminal 150 is aligned). Further, in this implementation, the terminal 140 can be entirely (nearly entirely, substantially entirely, etc.) vertically aligned with the terminal 150 along an axis A that is orthogonal to the first plane (along which the terminal 140 is aligned) and also orthogonal to the second plane (along which the terminal 150 is aligned).

In other arrangements, such as those shown in FIGS. 6A-6C, the power supply terminals may be only partially aligned along the axis A, and/or can have portions that are aligned (in parallel) along other axes and/or other planes, such as other planes aligned along axis P1 and axis P2 and/or one or more planes aligned along axis A and axis P2, as some examples. In still other arrangements, the retention portion 148 could be disposed around only around a portion of the terminal 140 or a portion of the terminal 150.

Depending on the particular implementation, the terminals 140 and 150 can be retained (affixed, secured, and so forth) in (to, etc.) the power supply terminal frame 145 in a number of ways. For instance, the terminals 140 and 150 can be frictionally retained in the power supply terminal frame 145, can be retained using an adhesive, or can be molded into the power supply terminal frame 145. In implementations, the power supply terminal frame 145 can be formed of epoxy, plastic, ceramic, or any appropriate electrically-insulative material.

The module 300, as illustrated in FIGS. 3A and 3B, can also include the output terminal 160. In this implementation, the power supply terminal assembly 310 is disposed at a first end of the module 300, while the output terminal 160 is disposed at a second of the module 300, the second end being opposite the first end. In other implementations, other arrangements of the output terminal (e.g., with respect to the power supply terminal assembly 310) are possible.

FIG. 3D is a diagram illustrating an isometric view of the power terminal assembly 310 of the power semiconductor module 300 of FIG. 3A, according to an implementation. As illustrated in FIG. 3D, the terminals 140 and 150 can have each have a flared portion (that is encapsulated with the EMC 210 in the module 300 and is out of plane with the portion of the terminal 140 or 150 that is disposed outside the EMC 210 in the module 300). As shown in FIGS. 4A and 4C, the flared portion of each of the terminals 140 and 150 can be affixed (e.g., using DLA) to a respective substrates (e.g., substrates 180 and 190) of the module 300, e.g. the inner surfaces of the substrates 180 and 190 of the module 300. In certain implementations, the portion of each of the terminals 140 and 150 that are encapsulated within the EMC 210 can be planar (coplanar) with the respective portion of each of the terminals 140 and 150 that is disposed outside the EMC 210.

FIG. 4A is a diagram illustrating a sectional view of the power semiconductor module 300 of FIGS. 3A-3C prior to transfer molding with an epoxy molding compound, according to an implementation. FIG. 4B is a diagram illustrating a sectional view of the power semiconductor module 300 of 4A (and FIGS. 3A-3C) after transfer molding, according to an implementation. As can be seen from FIGS. 4A and 4B, the power supply terminal frame 145, as well as the power supply terminal assembly 310, can have a first portion that is encapsulated in the EMC 210 and a second portion that is disposed outside the EMC 210.

The power supply terminal assembly 310 includes the terminal 140, the isolation portion 146 of the power supply terminal frame 145 and the terminal 150 arranged in stack, with a first portion of this stack being disposed with the EMC 210 and a second portion of this stack being disposed outside the EMC 210. This arrangement will prevent a potting line (such as the potting line 215 of FIG. 2B) from forming between the terminal 140 and 150 during the transfer molding process, as the isolation portion 146 of the power supply terminal frame 145 is disposed between the terminals 140 and 150 at the point where the power supply terminal assembly 310 extends out of the EMC 210 rather than the terminals 140 and 150 having the EMC 210 disposed therebetween, as shown in FIG. 2B. Accordingly, the power supply terminal frame 145 and its isolation portion 146 can allow for close spacing of the power supply terminals 140 and 150 to reduce stray inductance, while also preventing (e.g., by the isolation portion 146) EMC leakage current between the power supply terminals 140 and 150 during operation of the module 300.

FIG. 4C is a diagram illustrating a side view of the power semiconductor module 300 of FIGS. 3A-3C prior to transfer molding with EMC 210. As shown in FIG. 4C (similar to the module 200), the module 300 can include a first substrate 180, to which the power supply terminal 140 is electrically coupled (e.g., using DLA or other approach). The module 300, as shown in FIG. 4C, also includes a second substrate 190, to which the power supply terminal 150 and the output terminal 160 are electrically coupled (e.g., using DLA or other approach). The other elements of the circuit 100 can be included in the module 300 (e.g., on the substrates 180 and 190) as appropriate for a given implementation. Further, the substrates 180 and 190 can be operatively coupled with each (e.g. using conductive connectors, conductive spacers, etc.) to implement the circuit 100 (or other circuit). In other implementations, the output terminal 160 could be coupled with the first substrate 180, rather than the second substrate 190.

FIGS. 5A and 5B are diagrams illustrating a comparison of a main current path 105 and associated magnetic fields of the power semiconductor module 300 of FIG. 3A (shown in FIG. 5A) and a main current path 505 and associated magnetic fields of a power semiconductor module 500 with coplanar power terminals (shown in FIG. 5B), according to an implementation. In FIG. 5A, the main current path 105 is illustrated as being from terminal 150 (not shown in FIG. 5A) of the module 300 through the circuit node of the circuit 100 associated with the output node 160 and back to the terminal 140. As shown in FIG. 5A, a magnetic field 147 can be generated by current flowing through (e.g., out of) the terminal 140), while a magnetic field 157 can be generated by current flowing through (e.g., into) the terminal 150. As shown in FIG. 5A, due to the parallel (physically parallel) arrangement of the terminals 140 and 150, the magnetic fields 147 and 157 have significant overlap and (because they are opposing magnetic fields) will cancel each other to reduce the net magnetic field applied to each of the supply terminals 140 and 150.

In comparison, as shown in FIG. 5B, the main current path 505 is illustrated as being from terminal 550 of the module 500 through the circuit node of the circuit 100 associated with the output node 560 and back to the terminal 540. As shown in FIG. 5B, a magnetic field 547 can be generated by current flowing through (e.g., out of) the terminal 540), while a magnetic field 557 can be generated by current flowing through (e.g., into) the terminal 550. As shown in FIG. 5B, due to the coplanar and laterally spaced physical arrangement of the terminals 540 and 550, the magnetic fields 547 and 557 have much less overlap than the magnetic field 147 and 157 and, therefore each of the terminals 540 and 550 will be subjected to a much higher magnetic field than the terminals 140 and 150 of the module 300 when operating the circuit 100 in each of the modules 300 and 500 under the same (or substantially the same) operating conditions. Accordingly, the module 500 (even though schematically equivalent with the module 300 when implementing the circuit 100) will have higher stray inductance between the terminals 540 and 550 than a stray inductance that the module 300 has between the terminal 140 and 150. In an implementation, the stray inductance of the module 300 can be approximately seventy-five percent less than the stray inductance of the module 500.

FIGS. 6A-6C are diagrams illustrating various configurations of power supply terminal assemblies, according to respective implementations. Such alternative configurations can be used for particular implementations, such as to accommodate mounting a packaged semiconductor module in a specific system or board. As with the power supply terminal assembly 310, the power supply terminal assemblies 610a-610c, due to their parallel (physically parallel) arranged power supply terminals can be used to produce semiconductor circuit modules with reduced stray inductance, as compared to modules with coplanar and laterally spaced power supply terminals.

FIG. 6A illustrates a power terminal assembly 610a, FIG. 6B illustrates a power terminal assembly 610b and FIG. 6C illustrates a power terminal assembly 610c. The power terminal assemblies 610a-610c of FIGS. 6A-6C can be used, for example, in place of the power terminal assembly 310 in the module 300. The power supply terminal assemblies 310 and 610a-610c can also be used in other packaged semiconductor devices and modules having other arrangements and/or implementing other circuits than the circuit 100.

The power terminal assembly 610a of FIG. 6A includes a first power supply terminal 140a, a second power supply terminal 150a and a power terminal frame 145a. As can be seen in FIG. 6A, the portions of the power supply terminal 140a and the power supply terminal 150a that are disposed outside of the EMC 210 in the module 300 can collectively define a Y-shape.

The power terminal assembly 610b of FIG. 6B includes a first power supply terminal 140b, a second power supply terminal 150b and a power terminal frame 145b. As can be seen in FIG. 6B, the portion of the power supply terminal 140b that would be disposed outside the EMC 210 of the module 300 can be shorter than the portion of the power supply terminal 150b that would be disposed outside the EMC 210 of the module 300. That is only a portion of the terminal 150b (because it is longer than the terminal 140b) would be vertically aligned with the terminal 140b along the axis A in FIG. 3B.

The power terminal assembly 610c of FIG. 6C includes a first power supply terminal 140c, a second power supply terminal 150c and a power terminal frame 145c. As can be seen in FIG. 6C, the portions of the power supply terminal 140c and 150c that would be disposed outside the EMC 210 of the module 300 are both L-shaped, with the terminal 150c be longer than the terminal 140c. In this arrangement, only a portion of the terminal 150c (because it is longer than the terminal 140c) would be vertically aligned with the terminal 140c along the axis A in FIG. 3B. Additionally, other portions (e.g., along the bottoms of the L-shapes) of the terminals 140c and 150 are aligned along an axis that is orthogonal to the axis A in FIG. 3B.

FIG. 7 is a diagram illustrating a process flow method for producing a first substrate assembly 700 that can be included in a packaged semiconductor device and/or module, according to an embodiment. The process flow of FIG. 7 includes operations 710-750, which are described individually below. For each process operation in FIG. 7, two diagrams are illustrated, a bottom diagram and a top diagram. The bottom diagrams illustrate side views corresponding with the respective process operations, while the top diagrams illustrate isometric views corresponding with the respective process operations. In FIG. 7, reference numbers are shown with reference to the bottom diagrams for each process operation. The process operations illustrated in FIG. 7 are shown by way of example, and the diagrams may not be to scale. Further, in the diagrams of FIG. 7, some elements of the substrate assembly 700 (e.g., elements added during an earlier processing operation) may not be shown.

In FIG. 7, at process operation 710, a substrate 190 (such as the substrate 190 described above) can be provided. The substrate 190 can be, for example, a DBC substrate, that includes patterned copper (e.g., on both sides of the substrate 190) corresponding with a packaged semiconductor device and/or module in which the substrate assembly 700 will be included. At process operation 720 in FIG. 7, a solder pattern 725 can be formed on the substrate 190. The solder pattern 725 can be formed using, e.g., a solder screen printing process. At process operation 730 of FIG. 7, a semiconductor die (or semiconductor dice), such as the IGBTs 110 and 120 and the control circuit 130 of the module 300 can be placed at appropriate locations on (in correspondence with) the solder pattern 725 and affixed to the substrate 190 using a solder reflow operation. For purposes of illustration, the IGBT 110 is shown in FIG. 7. At operation 740 of FIG. 7, wire bonds 745 can be formed between the substrate 190 and one or more of the semiconductor die affixed to the substrate 190. At operation 750 of FIG. 7, a solder pattern 755 (or solder patterns) can be formed on the semiconductor die 100 (and other semiconductor dice). In an implementation, the solder pattern 755 can be formed using a solder dotting process. At operation 760 of FIG. 7, spacer(s) 765 can be placed at appropriate locations on (in correspondence with) the solder pattern 755 to complete, in this example, the substrate assembly 700. Depending on the particular implementation, a solder reflow operation can be performed as part of operation 760 to affix the spacer(s) 765 to the semiconductor die (or dice). In other implementations, the spacer(s) 765 can be affixed to the semiconductor die (or dice) during a reflow operation performed as part of a subsequent processing operation (e.g., such as processing operation 1020 of FIG. 10).

FIG. 8 is a diagram illustrating a process flow method for producing a second substrate assembly 800 that can be included in a packaged semiconductor device and/or module, according to an embodiment. The process flow of FIG. 8 includes operations 810 and 820, which are described individually below. For each process operation in FIG. 8, as for the process operations of FIG. 7, two diagrams are illustrated, a bottom diagram and a top diagram. The bottom diagrams illustrate side views corresponding with the respective process operations, while the top diagrams illustrate isometric views corresponding with the respective process operations. As with FIG. 7, in FIG. 8, reference numbers are shown with reference to the bottom diagrams. The process operations illustrated in FIG. 8 are shown by way of example and the diagrams may not be to scale.

In FIG. 8, at process operation 810, a substrate 185 can be provided. The substrate 185, as with the substrate 190, can be, for example, a DBC substrate, that includes patterned copper (e.g., on both sides of the substrate 185) corresponding with a packaged semiconductor device and/or module in which the substrate assembly 800 will be included. At process operation 820 in FIG. 8, a solder pattern 825 can be formed on the substrate 185 to complete, in this example, the substrate assembly 800. The solder pattern 825, as with the solder pattern 725, can be formed using, e.g., a solder screen printing process. The solder pattern 825 (which, though not shown in FIG. 8, can be formed on both sides of the substrate 185) and can be used (e.g., during the reflow operation of process operation 1020 in FIG. 10) to affix the substrate assembly 800 to one of more spacers 765 of the substrate assembly 700 and/or to affix the substrate assembly 800 to the substrate assembly 800 (such as in the arrangement shown in FIG. 10).

FIG. 9 is a diagram illustrating a process flow method for producing a third substrate assembly 900 that can be included in a packaged semiconductor device and/or module, according to an embodiment. The process flow of FIG. 9 includes operations 910 and 920, which are described individually below. For each process operation in FIG. 9, as for the process operations of FIGS. 7 and 8, two diagrams are illustrated, a bottom diagram and a top diagram. The bottom diagrams illustrate side views corresponding with the respective process operation, while the top diagrams illustrate isometric views corresponding with the respective process operations. As with FIGS. 7 and 8, in FIG. 9, reference numbers are shown with reference to the bottom diagrams. The process operations illustrated in FIG. 9 are shown by way of example and may not be to scale.

In FIG. 9, at process operation 910, a substrate 180 (such as the substrate 180 described above) can be provided. The substrate 180, as with the substrates 190 and 185, can be, for example, a DBC substrate, that includes patterned copper (e.g., on both sides of the substrate 190) corresponding with a packaged semiconductor device and/or module in which the substrate assembly 900 will be included. At process operation 920 in FIG. 9, a solder pattern 925 can be formed on the substrate 180 to complete, in this example, the substrate assembly 900. The solder pattern 925, as with the solder patterns 725 and 825, can be formed using, e.g., a solder screen printing process. The solder pattern 925 can be used (e.g., during the reflow operation of process operation 1020 in FIG. 10) to affix the substrate assembly 900 to one of more spacers 765 of the substrate assembly 700 and/or to affix the substrate assembly 900 to the substrate assembly 800 (such as in the arrangement shown in FIG. 10).

FIG. 10 is a diagram illustrating a process flow method for producing a semiconductor device and/or module (such as the module 300 described above) including the substrate assemblies 700, 800 and 900 of FIGS. 7-9, according to an embodiment. For purposes of illustration, the process operations of FIG. 10 will be described with further reference to, at least, FIGS. 3A-3D and 7-9. The process flow of FIG. 10 includes operations 1010-103, which are described individually below. The process operations illustrated in FIG. 10 are shown by way of example and may not be to scale.

In FIG. 10, at process operation 1010, the substrate assemblies 700, 800 and 900 are placed in an alignment tool (alignment jig, etc.) 1015, e.g., to properly align the substrate assemblies 700, 800 and 900 with each for the module 300 being produced. Further at operation 1010, the power terminal assembly 310, the output terminal 160 and the signal leads 170 (not shown in FIG. 10) can also be placed in the alignment tool 1015 to properly align them in the module 300. In certain implementations, additional solder patterns can be formed on the substrate assemblies 700, 800 and/or 900, e.g., prior to their insertion in the alignment tool 1015, where such additional solder patterns can be us for affixing the power terminal assembly 310, the output terminal 160 and the signal leads 170 to the appropriate substrate(s) for the module 300. In other implementations, solder (e.g., solder paste, etc.), a conductive adhesive or other material could be applied to the power terminal assembly 310, the output terminal 160 and the signal leads 170 prior to their placement in the alignment tool 1015.

After alignment of the substrates 700, 800 and 900, the power terminal assembly 310, the output terminal 160 and the signal leads 170 in the alignment tool 1015 at block 1010, a solder reflow operation can be performed at process operation 1020 to affix (e.g., permanently affix, fixedly attach, etc.) the various portions of the module 300 with each other, and to form low resistance contacts (e.g. solder contact) between the various elements of the module 300. At process operation 1030 of FIG. 10, a transfer molding process can be performed to encapsulate the module 200 in EMC 210 (e.g., such as shown in FIG. 3A).

In a first example, an apparatus can include: a first substrate; a second substrate operatively coupled with the first substrate; and a power supply terminal assembly including: a first power supply terminal aligned along a first plane, the first power supply terminal being electrically coupled with the first substrate; a second power supply terminal aligned along a second plane, the second power supply terminal being electrically coupled with the second substrate; and a power supply terminal frame including: an isolation portion disposed between the first power supply terminal and the second power supply terminal; and a retention portion disposed around a portion of the first power supply terminal and disposed around a portion of the second power supply terminal, the retention portion affixing the first power supply terminal to a first side of the isolation portion and affixing the second power supply terminal to a second side of the isolation portion such that the first plane is parallel to the second plane.

In a second example based on the first example, the portion of the first power supply terminal can be vertically aligned with the portion of the second power supply terminal along an axis that is orthogonal to the first plane and the second plane.

In the third example based on any one of the previous examples, the first power supply terminal can be substantially entirely vertically aligned with the second power supply terminal along an axis that is orthogonal to the first plane and the second plane.

In a fourth example based on any one of the previous examples, the first power supply terminal can be direct lead attached to the first substrate and the second power supply terminal can be direct lead attached to the second substrate.

In a fifth example based on any of the first, second and fourth examples, the first power supply terminal can have a first length and the second power supply terminal can have a second length, the second length can be different than the first length.

In a sixth example based on any of the first, second and fourth examples examples, each of the first power supply terminal and the second power supply terminal can be L-shaped.

In a seventh example based on any of the first through fourth examples, a portion of the first power supply terminal and a portion of the second power supply terminal disposed outside a molding compound of the apparatus can collectively define a Y-shape.

In an eighth example based on any one of the previous examples, the power supply terminal frame can be formed from one of plastic, epoxy and ceramic.

In ninth example, an apparatus can include: a power semiconductor circuit; a molding compound that at least partially encapsulates the power semiconductor circuit; and a power terminal assembly including: a power supply terminal frame; a first power supply terminal aligned along a first plane, the first power supply terminal being operatively coupled with the power semiconductor circuit and affixed in the power supply terminal frame; and a second power supply terminal aligned along a second plane, the second power supply terminal being operatively coupled with the power semiconductor circuit and affixed in the power supply terminal frame such that the second plane is parallel to the first plane and at least a portion of the first power supply terminal is vertically aligned with the second power supply terminal along an axis that is orthogonal to the first plane and the second plane, a first portion of the power terminal assembly being encapsulated in the molding compound and a second portion of the power terminal assembly being disposed outside the molding compound.

In a tenth example based on the ninth example, the apparatus can further include an output signal terminal operatively coupled with the power semiconductor circuit, a first portion of the output signal terminal being encapsulated in the molding compound and a second portion of the output signal terminal being disposed outside the molding compound at a first end of the apparatus, the power terminal assembly having a portion disposed outside the molding compound at a second end of the apparatus opposite the first end.

In an eleventh example based on any one of the ninth and tenth examples, the first power supply terminal can have a first length and the second power supply terminal can have a second length, the second length being different than the first length.

In a twelfth example based on any one of the ninth and tenth examples, the first power supply terminal can be substantially entirely vertically aligned with the second power supply terminal along the axis that is orthogonal to the first plane and the second plane.

In a thirteenth example based on any one of the ninth and tenth examples, each of the first power supply terminal and the second power supply terminal can be L-shaped.

In a fourteenth example based on any one of the ninth, tenth and twelfth examples, a portion of the first power supply terminal being disposed outside the molding compound and a portion of the second power supply terminal being disposed outside the molding compound can collectively define a Y-shape.

In a fifteenth example based on any one of the ninth through fourteenth examples, the power supply terminal frame can include: a first portion that electrically isolates the first power supply terminal with the first power supply terminal from the second power supply terminal; and a second portion that that affixes the first power supply terminal to a first side of the first portion of the power supply terminal frame and affixes the second power supply terminal to a second side of the first portion of the power supply terminal frame, the second side of the first portion of the power supply terminal frame being opposite the first side of the first portion of the power supply terminal frame.

In a sixteenth example based on any one of the ninth through fifteenth examples, the power supply terminal frame can be formed from one of plastic, epoxy and ceramic.

In a seventeenth example, an apparatus can include a first substrate having a plurality of semiconductor devices disposed thereon; a second substrate operatively coupled with the first substrate; a third substrate operatively coupled with the first substrate and the second substrate, the third substrate being disposed between the first substrate and the second substrate; and a power supply terminal assembly including: a first power supply terminal aligned along a first plane, the first power supply terminal being electrically coupled with the first substrate; a second power supply terminal aligned along a second plane, the second power supply terminal being electrically coupled with the second substrate; and a power supply terminal frame including: an isolation portion disposed between the first power supply terminal and the second power supply terminal; and a retention portion disposed around a portion of the first power supply terminal and disposed around a portion of the second power supply terminal, the retention portion affixing the first power supply terminal to a first side of the isolation portion and affixing the second power supply terminal to a second side of the isolation portion such that the first plane is parallel to the second plane.

In an eighteenth example based on the seventeenth example, the first power supply terminal can be substantially entirely vertically aligned with the second power supply terminal along an axis that is orthogonal to the first plane and the second plane.

In a nineteenth example based on any of the seventeenth and eighteenth examples, the first power supply terminal can include a flared portion that is direct lead attached to the first substrate and the second power supply terminal can include a flared portion that is direct lead attached to the second substrate.

In a twentieth example based on any of the seventeenth through nineteenth examples, the apparatus can further include an output signal terminal that is direct lead attached to the first substrate, the first power supply terminal being disposed at a first end of the first substrate and the output signal terminal being disposed at a second end of the first substrate, the second end being opposite the first end.

It will be understood that, in the foregoing description, when an element, such as a layer, a region, or a substrate, is referred to as being on, connected to, electrically connected to, coupled to, or electrically coupled to another element, it may be directly on, connected or coupled to the other element, or one or more intervening elements may be present. In contrast, when an element is referred to as being directly on, directly connected to or directly coupled to another element or layer, there are no intervening elements or layers present. Although the terms directly on, directly connected to, or directly coupled to may not be used throughout the detailed description, elements that are shown as being directly on, directly connected or directly coupled can be referred to as such. The claims of the application may be amended to recite exemplary relationships described in the specification or shown in the figures.

As used in this specification, a singular form may, unless definitely indicating a particular case in terms of the context, include a plural form. Spatially relative terms (e.g., over, above, upper, under, beneath, below, lower, and so forth) are intended to encompass different orientations of the device in use or operation in addition to the orientation depicted in the figures. In some implementations, the relative terms above and below can, respectively, include vertically above and vertically below. In some implementations, the term adjacent can include laterally adjacent to or horizontally adjacent to.

Some implementations may be implemented using various semiconductor processing and/or packaging techniques. Some implementations may be implemented using various types of semiconductor device processing techniques associated with semiconductor substrates including, but not limited to, for example, Silicon (Si), Galium Arsenide (GaAs), Galium Nitride (GaN), and/or so forth.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components and/or features of the different implementations described.

What is claimed is:
1. An apparatus comprising:
a first substrate;
a second substrate operatively coupled with the first substrate;
a power supply terminal assembly including:
a first power supply terminal aligned along a first plane, the first power supply terminal being electrically coupled with the first substrate;
a second power supply terminal aligned along a second plane, the second power supply terminal being electrically coupled with the second substrate; and
a monolithic power supply terminal frame including:
an isolation portion disposed between the first power supply terminal and the second power supply terminal; and
a retention portion disposed around a portion of the first power supply terminal and disposed around a portion of the second power supply terminal, the retention portion affixing the first power supply terminal to a first side of the isolation portion and affixing the second power supply terminal to a second side of the isolation portion such that the first plane is parallel to the second plane; and
a molding compound at least partially encapsulating the apparatus.

2. The apparatus of claim 1, wherein the portion of the first power supply terminal is vertically aligned with the portion of the second power supply terminal along an axis that is orthogonal to the first plane and the second plane.

3. The apparatus of claim 1, wherein the first power supply terminal is substantially entirely vertically aligned with at least a portion of the second power supply terminal along an axis that is orthogonal to the first plane and the second plane.

4. The apparatus of claim 1, wherein the first power supply terminal is direct lead attached to the first substrate and the second power supply terminal is direct lead attached to the second substrate.

5. The apparatus of claim 1, wherein the first power supply terminal has a first length and the second power supply terminal has a second length, the second length being different than the first length.

6. The apparatus of claim 1, wherein each of the first power supply terminal and the second power supply terminal is L-shaped.

7. The apparatus of claim 1, a portion of the first power supply terminal and a portion of the second power supply terminal being disposed outside a molding compound of the apparatus collectively define a Y-shape.

8. The apparatus of claim 1, wherein the monolithic power supply terminal frame is formed from one of plastic, epoxy and ceramic.

9. An apparatus comprising: a power semiconductor circuit; a molding compound that at least partially encapsulates the power semiconductor circuit; and a power terminal assembly including: a monolithic power supply terminal frame; a first power supply terminal aligned along a first plane, the first power supply terminal being operatively coupled with the power semiconductor circuit and affixed in the monolithic power supply terminal frame; and a second power supply terminal aligned along a second plane, the second power supply terminal being operatively coupled with the power semiconductor circuit and affixed in the monolithic power supply terminal frame such that the second plane is parallel to the first plane and at least a portion of the first power supply terminal is vertically aligned with the second power supply terminal along an axis that is orthogonal to the first plane and the second plane, a first portion of the power terminal assembly, including a first portion of the monolithic power supply terminal frame, being encapsulated in the molding compound and a second portion of the power terminal assembly, including a second portion of the monolithic power supply terminal frame, being disposed outside the molding compound.

10. The apparatus of claim 9, further comprising an output signal terminal operatively coupled with the power semiconductor circuit, a first portion of the output signal terminal being encapsulated in the molding compound and a second portion of the output signal terminal being disposed outside the molding compound at a first end of the apparatus, the power terminal assembly having a portion disposed outside the molding compound at a second end of the apparatus opposite the first end.

11. The apparatus of claim 9, wherein the first power supply terminal has a first length and the second power supply terminal has a second length, the second length being different than the first length.

12. The apparatus of claim 9, wherein the first power supply terminal is substantially entirely vertically aligned with at least a portion of the second power supply terminal along the axis that is orthogonal to the first plane and the second plane.

13. The apparatus of claim 9, wherein each of the first power supply terminal and the second power supply terminal is L-shaped.

14. The apparatus of claim 9, a portion of the first power supply terminal being disposed outside the molding compound and a portion of the second power supply terminal being disposed outside the molding compound collectively define a Y-shape.

15. The apparatus of claim 9, wherein the monolithic power supply terminal frame includes:
 a first portion that electrically isolates the first power supply terminal from the second power supply terminal; and
 a second portion that that affixes the first power supply terminal to a first side of the first portion of the monolithic power supply terminal frame and affixes the second power supply terminal to a second side of the first portion of the monolithic power supply terminal frame, the second side of the first portion of the monolithic power supply terminal frame being opposite the first side of the first portion of the monolithic power supply terminal frame.

16. The apparatus of claim 9, wherein the monolithic power supply terminal frame is formed from one of plastic, epoxy and ceramic.

17. An apparatus comprising:
 a first substrate having a plurality of semiconductor devices disposed thereon;
 a second substrate operatively coupled with the first substrate;
 a third substrate operatively coupled with the first substrate and the second substrate, the third substrate being disposed between the first substrate and the second substrate;
 a power supply terminal assembly including:
  a first power supply terminal aligned along a first plane, the first power supply terminal being electrically coupled with the first substrate;
  a second power supply terminal aligned along a second plane, the second power supply terminal being electrically coupled with the second substrate; and
  a monolithic power supply terminal frame including:
   an isolation portion disposed between the first power supply terminal and the second power supply terminal; and
   a retention portion disposed around a portion of the first power supply terminal and disposed around a portion of the second power supply terminal, the retention portion affixing the first power supply terminal to a first side of the isolation portion and affixing the second power supply terminal to a second side of the isolation portion such that the first plane is parallel to the second plane; and
 a molding compound at least partially encapsulating the apparatus.

18. The apparatus of claim 17, wherein the first power supply terminal is substantially entirely vertically aligned with at least a portion of the second power supply terminal along an axis that is orthogonal to the first plane and the second plane.

19. The apparatus of claim 17, wherein the first power supply terminal includes a flared portion that is direct lead attached to the first substrate and the second power supply terminal includes a flared portion that is direct lead attached to the second substrate.

20. The apparatus of claim 17, further comprising an output signal terminal that is direct lead attached to the first substrate, the first power supply terminal being disposed at a first end of the first substrate and the output signal terminal being disposed at a second end of the first substrate, the second end being opposite the first end.

\* \* \* \* \*